United States Patent
Prakash et al.

(10) Patent No.: US 11,258,444 B2
(45) Date of Patent: Feb. 22, 2022

(54) DEVICES AND METHODS FOR HIGH-EFFICIENCY POWER SWITCHING WITH CASCODE GAN

(71) Applicant: SCHNEIDER ELECTRIC IT CORPORATION, Foxboro, MA (US)

(72) Inventors: Indra Prakash, Bangalore (IN); Damir Klikic, Waltham, MA (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 40 days.

(21) Appl. No.: 16/838,530

(22) Filed: Apr. 2, 2020

(65) Prior Publication Data

US 2020/0366288 A1 Nov. 19, 2020

(30) Foreign Application Priority Data

May 17, 2019 (IN) .............................. 201911019601

(51) Int. Cl.
*H03K 17/687* (2006.01)
*H02J 9/06* (2006.01)

(52) U.S. Cl.
CPC .......... *H03K 17/6871* (2013.01); *H02J 9/062* (2013.01)

(58) Field of Classification Search
CPC ............... H03K 17/6871; H03K 17/74; H03K 17/04163; H03K 17/687; H03K 2017/6875
See application file for complete search history.

(56) References Cited

U.S. PATENT DOCUMENTS

| | | | | |
|---|---|---|---|---|
| 2008/0186004 A1* | 8/2008 | Williams | .............. | H02M 3/156 323/282 |
| 2008/0309307 A1* | 12/2008 | Wang | .................... | H02M 3/158 323/311 |
| 2014/0167100 A1 | 6/2014 | Ichikawa | | |
| 2016/0254808 A1 | 9/2016 | Sato et al. | | |

FOREIGN PATENT DOCUMENTS

EP 2693639 A1 2/2014

OTHER PUBLICATIONS wu, Chih-Chiang et al., Article, "Simulation Model Development for Packaged Cascode Gallium Nitride Field-Effect Transistors," Crystals 2017, 7, 250, pp. 1-18.
Extended European Search Report from corresponding European Application No. 20170521.7 dated Sep. 22, 2020.

* cited by examiner

*Primary Examiner* — Sibin Chen
(74) *Attorney, Agent, or Firm* — Lando & Anastasi, LLP

(57) ABSTRACT

According to one aspect, embodiments herein provide a power switching circuit, comprising a first terminal, a second terminal, a third terminal, and a plurality of switching devices, each switching device having a first transistor having a first gate, a first source, and a first drain, a second transistor having a second gate, a second source, a second drain coupled to the first source, and a bipolar body diode coupled between the second drain and the second source, and a unipolar diode configured to prevent a transition voltage applied across the first gate and the first source from exceeding a degradation threshold of the first transistor during a transition period, wherein a first switching device of the plurality of switching devices is coupled between the first and third terminals and the and a second switching device of the plurality of switching devices is coupled between the second and third terminals.

19 Claims, 9 Drawing Sheets

DEVICES AND METHODS FOR HIGH-EFFICIENCY POWER SWITCHING WITH CASCODE GAN

CROSS-REFERENCE TO RELATED APPLICATION

This application claims the benefit under 35 U.S.C. § 119 of Indian Application No. 201911019601, filed May 17, 2019, titled DEVICES AND METHODS FOR HIGH-EFFICENCY POWER SWITCHING WITH CASCODE GAN, which is hereby incorporated herein by reference in its entirety.

BACKGROUND

1. Field of Invention

Embodiments of the invention relate generally to power conversion, and more particularly, to power switching devices utilized for power conversion in an uninterruptible power supply.

2. Discussion of Related Art

The use of power devices, such as uninterruptible power supplies (UPS), to provide regulated, uninterrupted power for sensitive and/or critical loads, such as computer systems and other data processing systems, is known. Known uninterruptible power supplies include on-line UPS's, off-line UPS's, line interactive UPS's as well as others. On-line UPS's provide conditioned AC power as well as back-up AC power upon interruption of a primary source of AC power. Off-line UPS's typically do not provide conditioning of input AC power but do provide back-up AC power upon interruption of the primary AC power source. Line interactive UPS's are similar to off-line UPS's in that they switch to battery power when a blackout occurs but also typically include a multi-tap transformer for regulating the output voltage provided by the UPS.

SUMMARY

At least one aspect of the invention is directed to a power switching circuit, comprising: a first terminal, a second terminal, a third terminal, and a plurality of switching devices, each switching device having a first transistor having a first gate, a first source, and a first drain, a second transistor having a second gate, a second source, a second drain coupled to the first source, and a bipolar body diode coupled between the second drain and the second source, and a unipolar diode configured to prevent a transition voltage applied across the first gate and the first source from exceeding a degradation threshold of the first transistor during a transition period, wherein a first switching device of the plurality of switching devices is coupled between the first terminal and the third terminal and a second switching device of the plurality of switching devices is coupled between the second terminal and the third terminal.

According to one embodiment, the unipolar diode of each switching device of the plurality of switching devices has an anode coupled to the second source and a cathode coupled to the first drain. In another embodiment, the unipolar diode of each switching device of the plurality of switching devices has an anode coupled to the first gate and a cathode coupled to the first source.

According to another embodiment, each switching device of the plurality of switching devices is configured such that the first gate is coupled to the second source. In one embodiment, the first transistor of each switching device is a depletion mode transistor and the second transistor of each switching device is an enhancement mode transistor. In another embodiment, the first transistor of each switching device is a GaN HEMT and the second transistor of each switching device is a low-voltage FET. In one embodiment, the unipolar diode of each switching device is a Schottky Barrier diode. In another embodiment, the GaN HEMT and the low-voltage FET are contained on at least one substrate in a single package. In one embodiment, each switching device is fabricated such that the Schottky Barrier diode is connected externally to the package containing the GaN HEMT and the low-voltage FET. IN another embodiment, each switching device is fabricated such that the Schottky Barrier diode is included on the at least one substrate in the package containing the GaN HEMT and the low-voltage FET.

According to one embodiment, the third terminal is configured to be coupled to an AC power source, the first terminal and the second terminal are configured to be coupled to a DC bus, and the power switching circuit is configured to be operated as a power converter in a UPS. In another embodiment, the first terminal and the second terminal are configured to be coupled to a DC bus, the third terminal is configured to be coupled to a load, and the power switching circuit is configured to operate as a power inverter in a UPS. In one embodiment, the second terminal is coupled to a ground connection. In another embodiment, a third switching device of the plurality of switching devices is coupled between the first terminal and the third terminal and a fourth switching device of the plurality of switching devices is coupled between the second terminal and the third terminal.

Another aspect of the invention is directed to a method for maintaining operational efficiency of a switching device in a power switching circuit, the switching device having a first transistor and a second transistor, the first transistor having a first gate, a first source, and a first drain, the second transistor having a second gate, a second source, a second drain coupled to the first source, and a bipolar body diode coupled between the second drain and the second source, and a unipolar diode having an anode coupled to the second source and a cathode coupled to the first drain, wherein the method comprises receiving a transition current at the second source during a transition period of the power switching circuit, diverting at least a portion of the transition current through the unipolar diode to the first drain such that a transition voltage applied across the first gate and the first source does not exceed a degradation threshold of the first transistor, determining that the transition period of the power switching circuit has ended, and enabling, in response to a determination that the transition period has ended, the second transistor such that an operational current applied to the first drain is switched through the first transistor and the second transistor to the second source.

According to one embodiment, diverting the transition current through the unipolar diode prevents the transition voltage from exceeding the degradation threshold of the first transistor by reducing a forward recovery voltage of the bipolar body diode of the second transistor. In one embodiment, the first transistor is a GaN HEMT, the second transistor is a low-voltage FET, and the unipolar diode is a Schottky Barrier diode.

At least one aspect of the invention is directed to a method for maintaining operational efficiency of a switching device in a power switching circuit, the power switching device having a first transistor and a second transistor, the first transistor having a first gate, a first source, and a first drain, the second transistor having a second gate, a second source, and a second drain coupled to the first source, and a bipolar body diode coupled between the second drain and the second source, and a unipolar diode having a cathode coupled to the first source and an anode coupled to first, wherein the method comprises receiving a transition current at the second source during a transition period of the power switching circuit, regulating a transition voltage applied across the first gate and the first source via the unipolar diode such that the transition voltage does not exceed a degradation threshold of the first transistor, determining that the transition period of the power switching circuit has ended, and enabling, in response to a determination that the transition period has ended, the second transistor such that an operational current applied to the first drain is switched through the first transistor and the second transistor to the second source.

According to one embodiment, regulating the transition voltage via the unipolar diode reduces a forward recovery voltage of the bipolar body diode of the second transistor to prevent the transition voltage from exceeding the degradation threshold of the first transistor. In one embodiment, the first transistor is a GaN HEMT, the second transistor is a low-voltage FET, and the unipolar diode is a Schottky Barrier diode.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments and are incorporated in and constitute a part of this specification but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, power devices, such as uninterruptible power supplies (UPS), are oftentimes used to provide regulated, uninterrupted power to sensitive and/or critical loads. A conventional online UPS rectifies input AC power provided by an electric utility using a Power Factor Correction circuit (PFC) to provide DC power to at least one DC bus. The rectified DC power on the DC busses is typically used to charge a battery while mains power is available. In the absence of mains power, the battery discharges and provides DC power to the DC buses. From the DC power on the DC buses, an inverter generates an AC output voltage that is provided to a load. Since the DC bus is powered either by mains or the battery, the output power of the UPS is uninterrupted if the mains fails and the battery is sufficiently charged. Typical online UPS's may also operate in a bypass mode where unconditioned power with basic protection is provided directly from an AC power source to a load via a bypass line.

Figure 1:
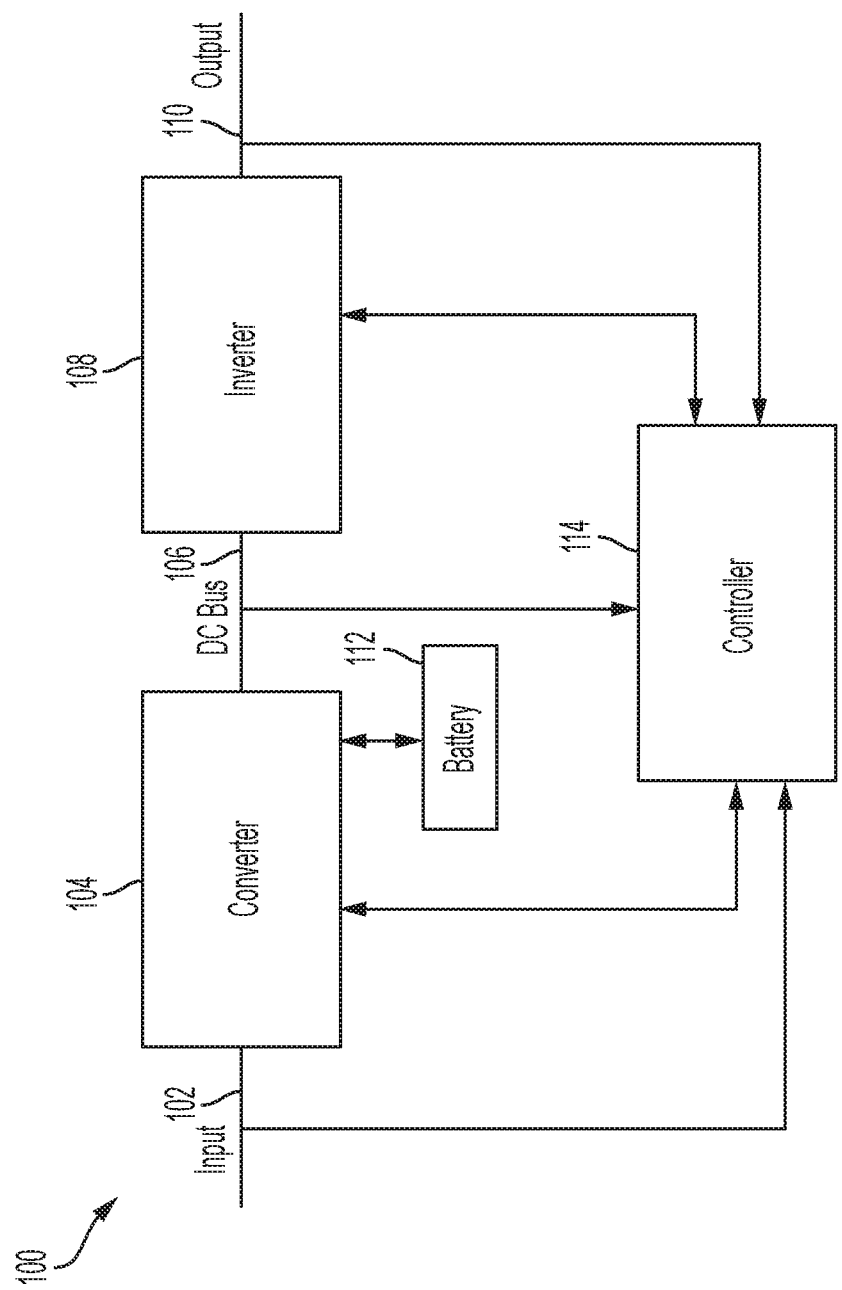
FIG. 1 is a functional block diagram of an uninterruptible power supply in accordance with one embodiment of the present invention.

FIG. 1 is a block diagram of one embodiment of a UPS 100 that provides regulated power from input AC power received at an input 102, as well as back-up power from a battery 112, to an output 110. The UPS 100 includes a converter 104, a DC bus 106, an inverter 108, and a controller 114 for controlling the converter and the inverter. The converter 104 is coupled to the input 102, the inverter 108 is coupled to the output 110, and the DC bus 106 is coupled between the converter 104 and the inverter 108.

The input 102 is configured to receive input AC power having an input voltage level from an AC power source. The controller 114 monitors the input AC power received by the input 102 and is configured to operate the UPS 100 in different modes of operation based on the status of the input AC power received by the input 102. When AC power provided to the input 102 is acceptable (i.e., above an input power threshold), the controller 114 operates the UPS 100 in an online mode of operation.

In the online mode of operation, AC power from the input 102 can be provided to the converter 104. According to one embodiment, the converter 104 is a Power Factor Correction (PFC) converter 104; however, in other embodiments, other types of converters may be utilized. The controller 114 operates the converter 104 to convert the AC power into DC power and provide the DC power to the DC bus 106. DC power from the DC bus 106 is provided to the inverter 108. The controller 114 operates the inverter 108 to convert the DC power into regulated AC power and provide the regulated AC power to a load coupled to the output 110.

When AC power provided to the input 102 is not acceptable (i.e., below an input power threshold), the controller 114 operates the UPS 100 in a backup mode of operation. In the backup mode of operation, DC power from the battery 112 is provided to the DC bus 106. The inverter 108 receives the DC power from the DC bus 106, and the controller 114 operates the inverter 108 to convert the DC power from the DC bus 106 into regulated AC power and provide the regulated AC power to the output 110.

As described above, a UPS can include various types of power converters for converting AC power to DC power, DC power to AC power, and DC power from one DC voltage level to another. For example, a conventional UPS typically includes two quadrant and/or four quadrant converters such as inverters, synchronous buck converters, boost converters, etc. These various power converters are known to include power switching circuits utilizing switching devices such as Field-Effect Transistors (FETs) and Insulated-Gate Bipolar Transistors (IGBTs). Gallium Nitrate (GaN) is a common wide-bandgap material used in the fabrication of FETs for power switching applications. GaN FETs, compared to Silicon FETs or IGBTs, can offer very high switching speeds, and thus reduce switching losses, enabling high frequency power converter designs. GaN FETs also can experience a much lower on-resistance at high voltages, even at high temperatures, compared to alternative switching devices.

One type of GaN technology commonly used in conventional power switching circuits is enhancement mode GaN (e-GaN). e-GaN FETs are normally-off devices, and can provide benefits such as lower on resistance, faster switching speeds, lower power consumption, and smaller packages compared to alternative switching devices such as Silicon FETs. However, with respect to power switching applications, e-GaN FETs can exhibit limitations such as low reliability, low gate voltage margins, and insufficient thermal performance.

Figure 2:
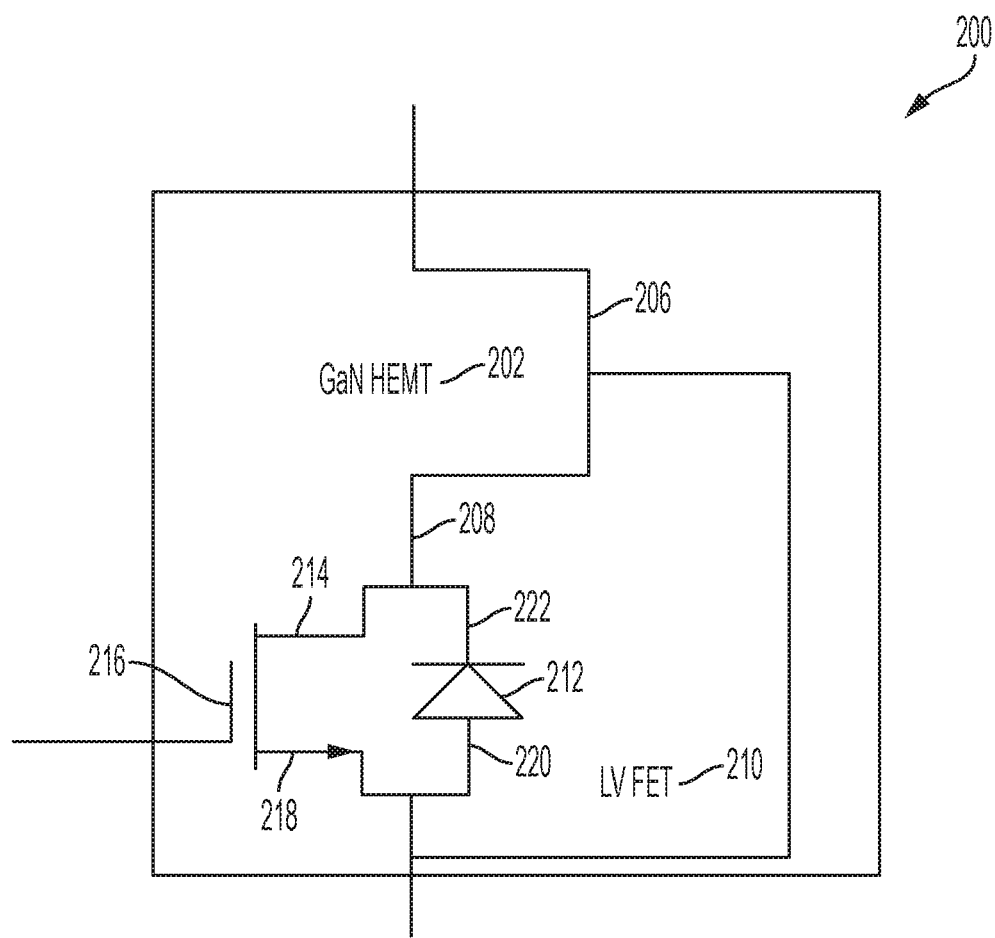
FIG. 2 is a schematic diagram of a conventional Cascode GaN power switching device.

Another type of GaN technology is Cascode GaN. Cascode GaN includes the utilization of a depletion mode GaN High-Electron-Mobility Transistor (HEMT). The GaN HEMT is a normally-on device. In a conventional Cascode GaN device, a normally-off, enhancement mode low-voltage Silicon FET is connected to a GaN HEMT in a cascode structure such that, in combination, the GaN HEMT and the low-voltage FET function as a normally-off device. For example, FIG. 2 is a schematic diagram illustrating a conventional Cascode GaN device 200. As illustrated in FIG. 2, the source 208 of the GaN HEMT 202 is coupled to the drain 214 of the low-voltage FET 210. The low-voltage FET 210 includes a body diode 212 having an anode 220 coupled to the source 218 and a cathode 222 coupled to the drain 214. The source 218 of the low-voltage FET 210 is also coupled to the gate 206 of the GaN HEMT 202. The Cascode GaN device 200 is turned on and off by applying a voltage across the gate 216 and the source 218 of the low-voltage FET 210.

Cascode GaN technology can address many of the limitations of e-GaN, as the utilization of GaN HEMTs and low-voltage FETs improves reliability at a lower cost. Cascode GaN devices also turn on fully at 10V and can tolerate ±20V, providing a much higher gate voltage margin than the 1V margin of e-GaN devices. In addition, Cascode GaN devices are typically produced in standard transistor outline (TO) packages which provide additional clearance from printed circuit boards compared to the surface mount device (SMD) packages of e-GaN devices. The additional clearance from the printed circuit board surface provided by the TO package results in improved thermal performance.

However, despite the advantages discussed above, conventional Cascode GaN devices can experience poor-efficiency in power switching applications. The gates of GaN HEMTs included in Cascode GaN devices are typically designed for +5V/−40V operation with a pinch-off voltage of −20V. If the gate-to-source voltage applied to the GaN HEMT exceeds +5V, charges are injected into the GaN HEMT and the drain-to-source on-resistance ($R_{ds(on)}$) of the GaN HEMT increases. The injected charge will only begin to dissipate when the gate-to-source voltage of the GaN HEMT is negatively biased below −20V for an extended period of time. In some cases, the GaN HEMT is required to be held in the pinch-off region for multiple hours to fully recover. When used in power switching applications, conventional Cascode GaN devices are often susceptible to this increasing $R_{ds(on)}$ effect and as a result device efficiency is degraded.

Figure 3A:
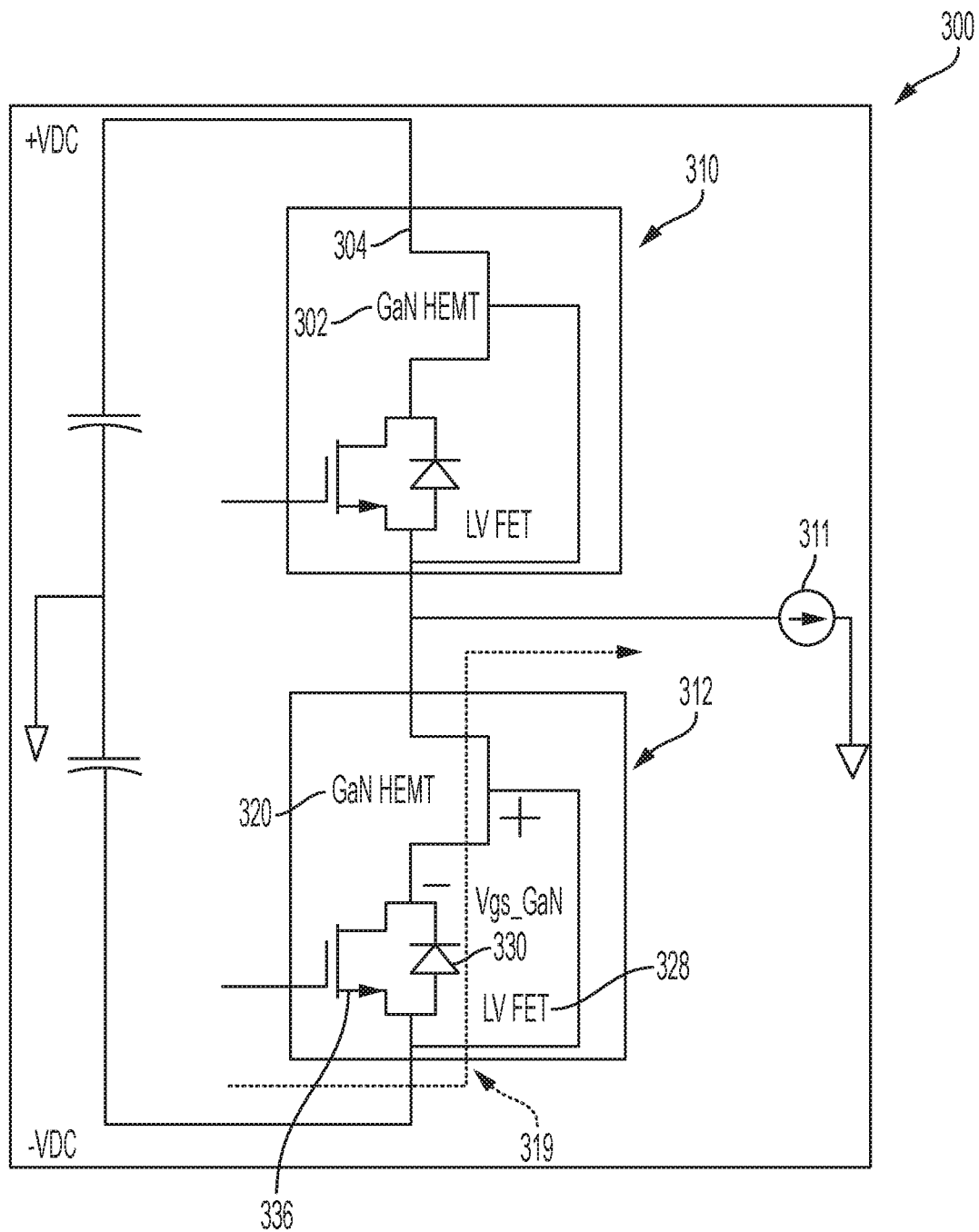
FIG. 3A is a schematic diagram of a conventional half-bridge inverter circuit.

For example, FIG. 3A is a schematic diagram of a typical half-bridge inverter 300 including a high-side Cascode GaN device 310 coupled to a low-side Cascode GaN device 312. A positive input terminal +VDC is coupled to the drain 304 of the GaN HEMT 302 of the high-side device 310 and a negative input terminal −VDC is coupled to the source 336 of the low-voltage FET 328 of the low-side device 312. A common load 311 is shared between the high-side device 310 and the low-side device 312.

Figure 3B:
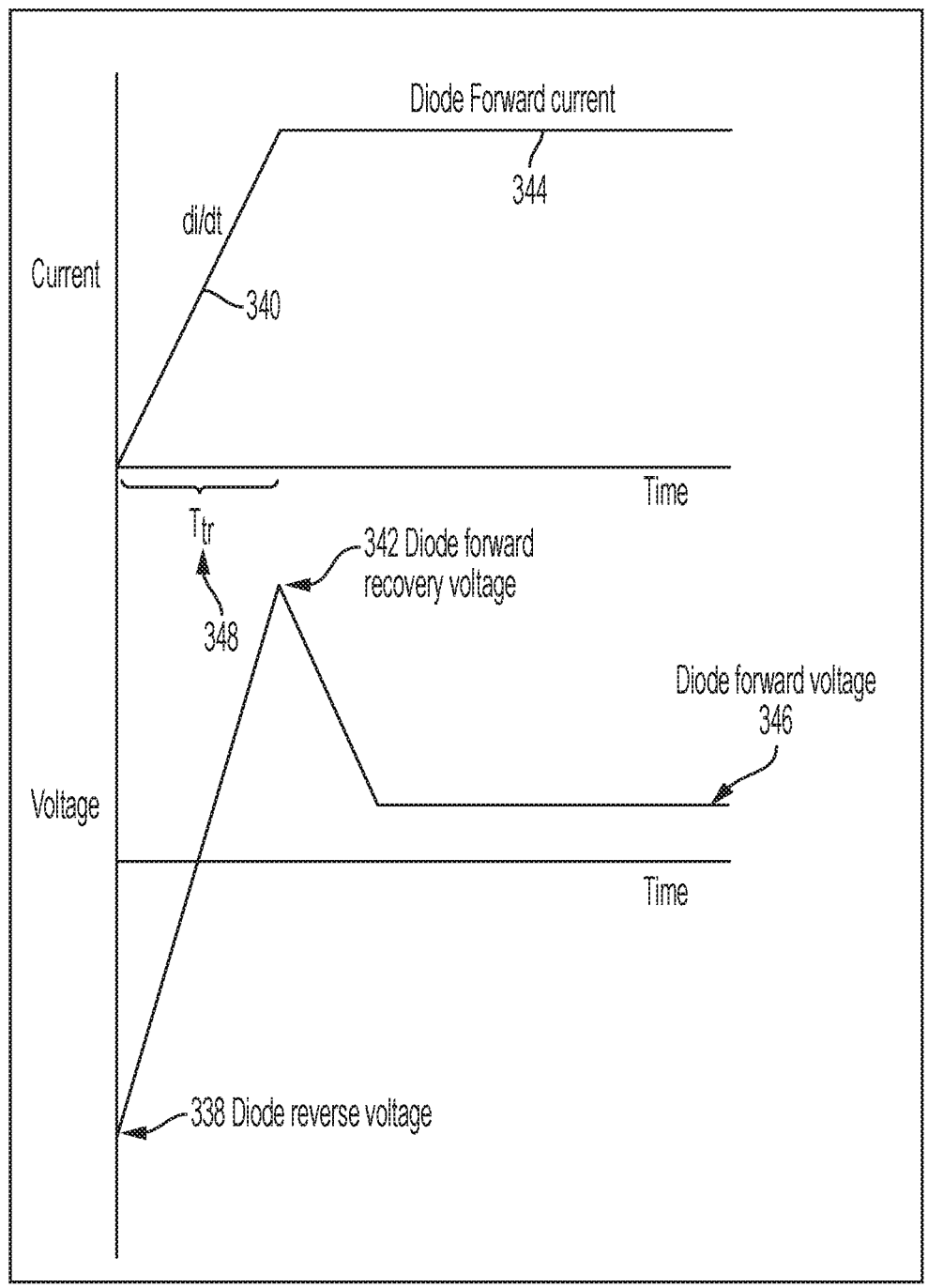
FIG. 3B is graph illustrating voltage and current waveforms associated with the half-bridge inverter circuit of FIG. 3A.

FIG. 3B. is a graph illustrating the current and voltage waveforms of the body diode 330 of the low-voltage FET 328 during a transition period (TO 348 of the half-bridge inverter 300. When the high-side device 310 is turned on, the low-side device 312 is turned off and current from the positive input terminal +VDC is switched through the high-side device 310 to the load 311. While the high-side device 310 is on, a reverse voltage 338 is applied to the body diode 330 of the low-voltage FET 328. Subsequently, when the high-side device 310 is turned off, a transition current 340 is transferred to the low-side device 312, which remains turned off. The transition current 340 transferred to the low-side device 312 begins to follow leakage path 319 through the body diode 330 of the low-voltage FET 328 and the GaN HEMT 320 in the reverse direction, as illustrated in FIG. 3A.

Due to the transition current 340 resulting from the turn-off speed of the high-side device 310, the body diode 330 of the low-voltage FET 328 develops a forward recovery voltage 342. The amplitude of the forward recovery voltage 342 depends on the transition current 340, the p-n junction structure of the body diode 330 of the low-voltage FET 328, and any inductance incurred from bonding wires, leads, and contacts. The forward recovery voltage 342 results in a significant voltage drop across the body diode 330 of the low-voltage FET 328, and thus a positive gate-to-source voltage is applied to the GaN HEMT 320. Once the positive gate-to-source voltage applied to the GaN HEMT 320 exceeds +5V, charges are injected into the GaN HEMT 320 and as a result the $R_{ds(on)}$ of the GaN HEMT 320 increases.

The transition current 340 following leakage path 319 through the body diode 330 of the low-voltage FET 328 stabilizes at a normal forward current 344 and the body diode 330 of the low-voltage FET 328 begins to operate with a normal forward voltage 346. However, the $R_{ds(on)}$ of the GaN HEMT 320 remains higher than normal until the GaN HEMT 320 is pinched-off such that the injected charge is permitted to dissipate. This increase in $R_{ds(on)}$ degrades the efficiency of the low-side device 312 and thus the half-bridge inverter 300. Accordingly, conventional Cascode GaN devices are typically restricted to low-current, low-speed power switching applications in order to maintain operational efficiency.

A more efficient, cost-effective, and reliable switching device for use in high-current, high-speed power switching applications is provided. In at least one embodiment, current provided to a Cascode GaN switching device is managed to maintain high operational efficiency in high-speed power switching applications across an expanded range of high-current loads. More specifically, current is diverted through a unipolar diode such that the GaN HEMT of the Cascode GaN switching device never develops a forward recovery voltage.

Figure 4A:
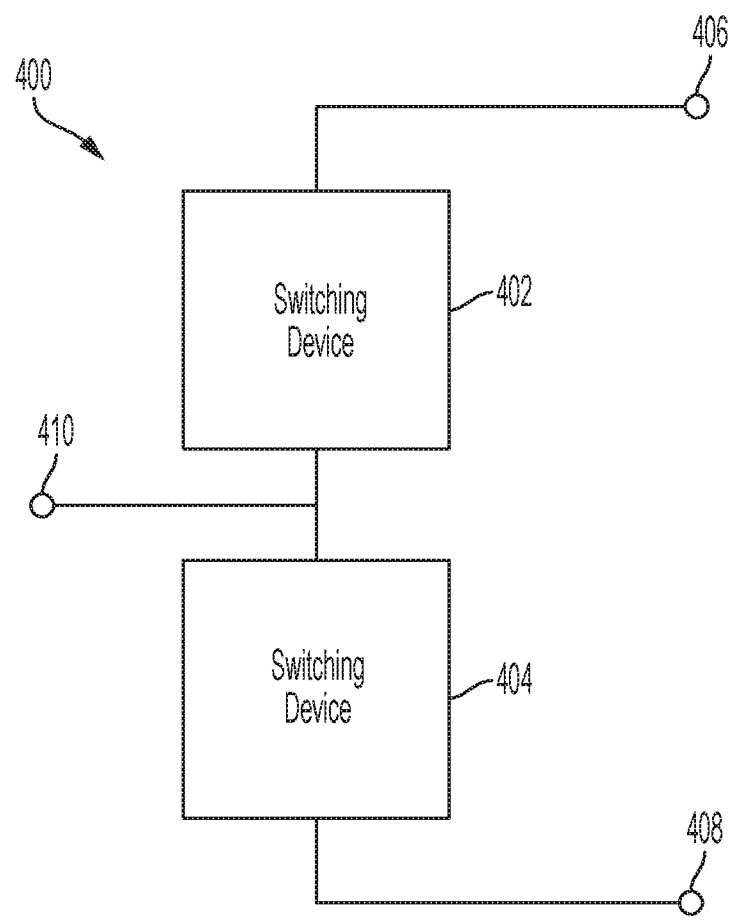
FIG. 4A is a functional block diagram of a power switching circuit in accordance with one embodiment of the present invention.

FIG. 4A is a block diagram of one embodiment of a power switching circuit 400 in accordance with aspects described herein. The power switching circuit 400 may be used, for example, in the converter 104 in a UPS similar to the UPS 100 shown in FIG. 1. The power switching circuit 400 includes a first switching device 402 coupled between an input 410 and a positive output 406, and a second switching device 404 coupled between the input 410 and a negative output 408. In one embodiment, the input 410 may be configured to receive AC power from an AC power source, and the power switching circuit 400 may be operated as a half-bridge converter to convert the received AC power into DC power, and to provide the DC power to the positive output 406 and the negative output 408. In other embodiments, the power switching circuit 400 may include a third and a fourth switching device and be configured to operate as a full-bridge converter. In some embodiments, the negative output 408 may be coupled to a ground or neutral connection.

Figure 4B:
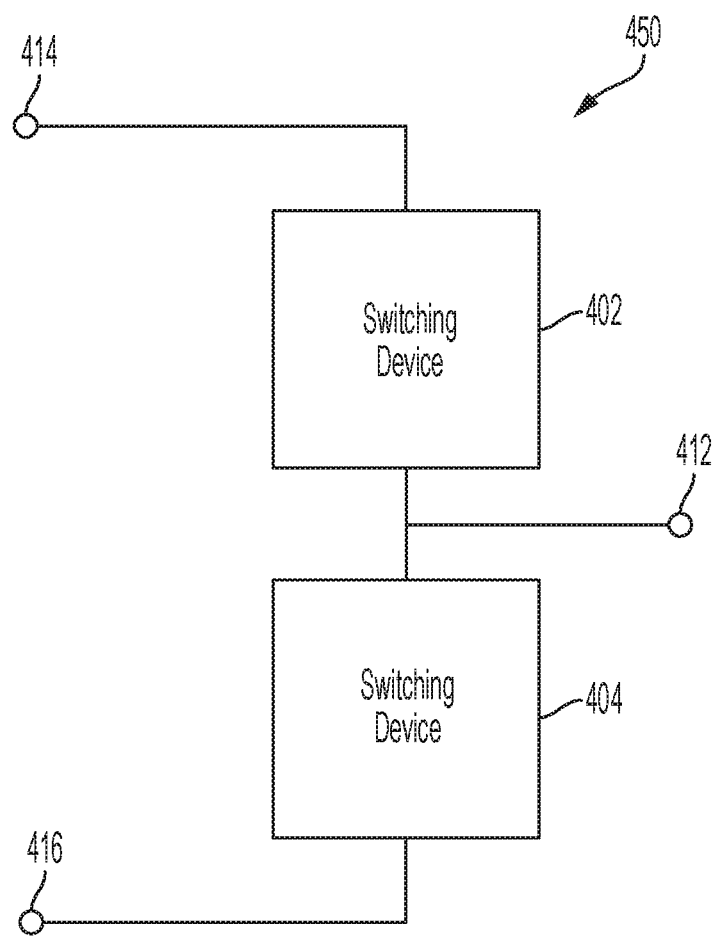
FIG. 4B is a functional block diagram of a power switching circuit in accordance with one embodiment of the present invention.

FIG. 4B is a block diagram of one embodiment of a power switching circuit 450 in accordance with aspects described herein. The power switching circuit 450 may be used, for example, in the inverter 108 in a UPS similar to the UPS 100 shown in FIG. 1. The power switching circuit 450 is configured such that the first switching device 402 is coupled between a positive input 414 and an output 412, and the second switching device 404 is coupled between a negative input 416 and the output 412. In one embodiment, the positive input 414 and the negative input 416 may be configured to receive DC power from a DC power source, such as a DC bus or a battery, and the power switching circuit 450 may be operated as a half-bridge inverter to convert the received DC power into AC power, and to provide the AC power to the output 412. In other embodiments, the power switching circuit 450 may include a third and a fourth switching device and be configured to operate as a full-bridge inverter. In some embodiments, the negative input 416 may be coupled to a ground or neutral connection.

In another embodiment, the power switching circuit 450 may be configured to operate as a half-bridge inverter similar to the half-bridge inverter 300 shown in FIG. 3A. For example, the first switching device 402 may be configured to operate as the high-side device 310 and second switching device 404 may be configured to operate as the low-side device 312.

Figure 5A:
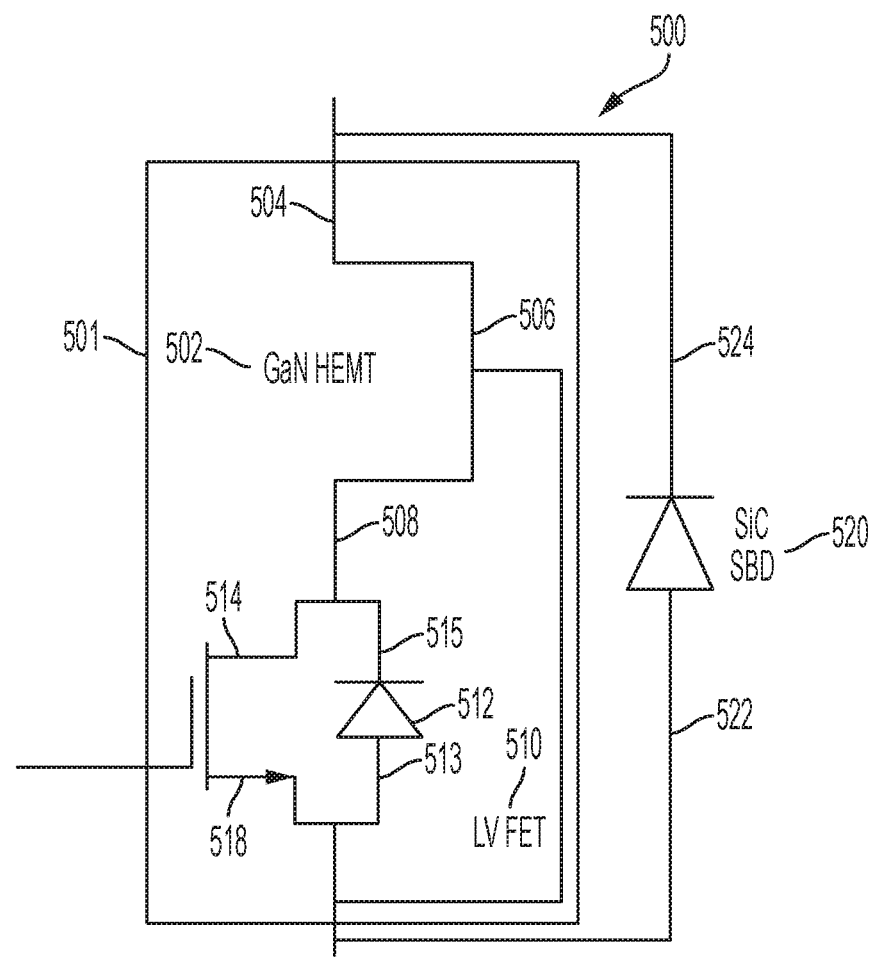
FIG. 5A is a schematic diagram a power switching device in accordance with one embodiment of the present invention.

FIG. 5A is a schematic diagram of one embodiment of a switching device 500 in accordance with aspects described herein. The switching device 500 may be used, for example, as the first switching device 402 or the second switching device 404 of power switching circuit 400 as shown in FIG. 4, or any other switching device in a power switching circuit.

The switching device 500 includes a normally-on, depletion mode GaN HEMT 502. The source 508 of the GaN HEMT 502 is coupled to the drain 514 of a normally-off, enhancement mode low-voltage FET 510. The GaN HEMT 502 and the low-voltage FET 510 are coupled in a cascode structure such that, in combination, the GaN HEMT 502 and the low-voltage FET 510 function as a normally-off device. The low-voltage FET 510 includes a body diode 512 having an anode 513 coupled to the source 518 and a cathode 515 coupled to drain 514. A Schottky Barrier diode (SBD) 520 is coupled across the GaN HEMT 502 and low-voltage FET 510. The anode 522 of the SBD 520 is coupled to the source 518 of the low-voltage FET 510 and the gate 506 of the GaN HEMT 502. The cathode 524 of the SBD 520 is coupled to the drain 504 of the GaN HEMT 502. In one embodiment, the SBD 520 is a Silicon Carbide (SiC) Schottky Barrier diode; however, in other embodiments, a different type of Schottky Barrier diode, or any other unipolar diode, can be utilized.

In at least one embodiment, the switching device 500 may experience a transition current during a transition period of a power switching circuit, similar to the transition period 348 and transition current 340 as discussed above in regard to FIG. 3B. The body diode 512 of the low-voltage FET 510 is a bipolar device having a p-n junction, and thus will develop a forward recovery voltage during the transition period when the transition current is applied to the source 518 of the low-voltage FET 510. However, the SBD 520 is a unipolar device which does not have a p-n junction and thus becomes forward biased before the body diode 512 of the low-voltage FET 510 develops a forward recovery voltage. Being that the anode 522 of the SBD 520 is coupled to the source 518 of the low-voltage FET 510, a majority of the transition current is diverted through the SBD 520, bypassing the low-voltage FET 510 and the GaN HEMT 502. By diverting current through the SBD 520, the forward recovery voltage of the body diode 512 of the low-voltage FET 510 is reduced during the transition period.

Once the transition period is over, the GaN HEMT 502 is turned on by enabling the low-voltage FET 510, and current is shared between the GaN HEMT 502 and the SBD 520. In one embodiment, a controller, such as controller 114, may be utilized to determine that the transition period is over and to enable the low-voltage FET 510. While the GaN HEMT 502 is turned on, the voltage drop of the SBD 520 becomes much higher than the GaN HEMT 502, and as a result a majority of the current is switched through the GaN HEMT 502 and the low-voltage FET 510. By diverting the transition current through the SBD 520 during the transition period and avoiding the forward recovery voltage of the body diode 512 of the low-voltage FET 510, the switching device 500 is able to maintain a high-level of efficiency in high-speed, high current power switching applications.

Figure 5B:
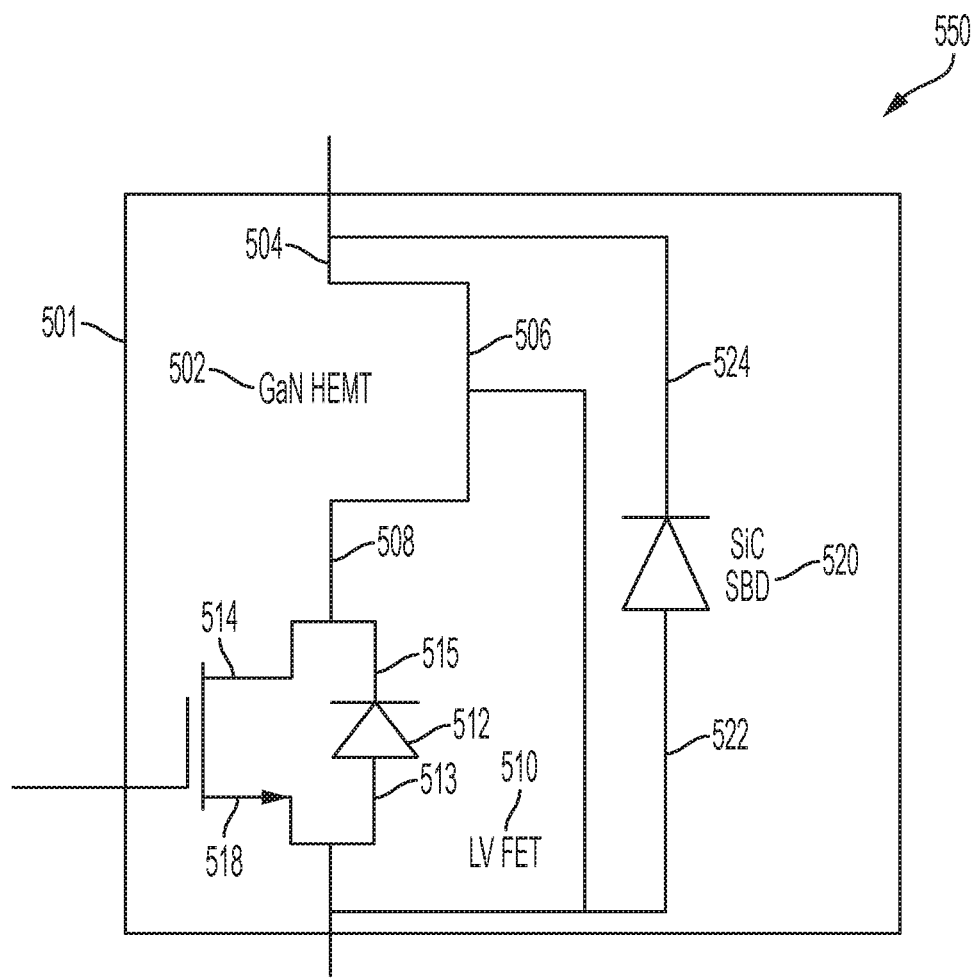
FIG. 5B is a schematic diagram a power switching device in accordance with one embodiment of the present invention.

According to at least one embodiment the switching device 500 is fabricated such that the SBD 520 is connected externally to a substrate 501 containing the GaN HEMT 502 and the low-voltage FET 510. In one embodiment, the substrate containing the GaN HEMT 502 and the low-voltage FET 510 is a Cascode GaN device. In another embodiment, as illustrated in FIG. 5B, a switching device 550 is shown that is similar to switching circuit 500, except that THE switching device 550 is fabricated such that the SBD 520 is included on the same substrate 501 containing the GaN HEMT 502 and the low-voltage FET 510. By including the SBD 520, GaN HEMT 502, and low-voltage FET 510 on the same substrate 501, any additional voltage drops associated with boding wires and leads can be minimized to further improve operational efficiency. In other embodiments, the SBD 520, GaN HEMT 502, and low-voltage FET 510 may be fabricated on multiple substrates included in a single package or chip. In one embodiment, the single package is a transistor outline (TO) package.

In at least one embodiment, current provided to a Cascode GaN switching device is managed to maintain high operational efficiency in high-speed power switching applications across an expanded range of high-current loads. More specifically, current is managed such that a forward recovery voltage is not applied to the GaN HEMT of the Cascode GaN switching device in a manner which degrades the Cascode GaN switching device.

Figure 6:
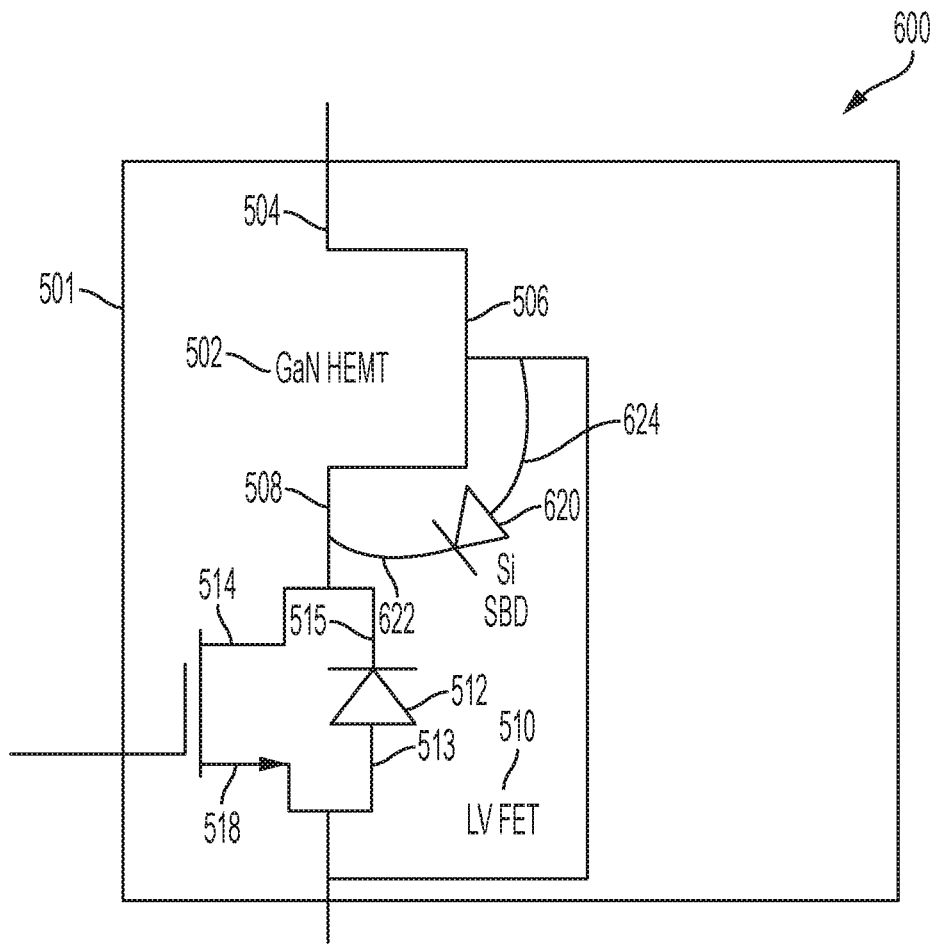
FIG. 6 is a schematic diagram of a power switching device in accordance with one embodiment of the present invention.

FIG. 6 is a schematic diagram of another embodiment of a switching device 600 in accordance with aspects described herein. The switching device 600 may be used, for example, as the first switching device 402 or the second switching device 404 of power switching circuit 400 as shown in FIG. 4, or any other switching device in a power switching circuit.

The switching device 600 includes a normally-on, depletion mode GaN HEMT 502. The source 508 of the GaN HEMT 502 is coupled to the drain 514 of a normally-off, enhancement mode low-voltage FET 510. The GaN HEMT 502 and the low-voltage FET 510 are coupled in a cascode structure such that, in combination, the GaN HEMT 502 and the low-voltage FET 510 function as a normally-off device. The low-voltage FET 510 includes a body diode 512 having an anode 513 coupled to the source 518 and a cathode 515 coupled to the drain 514. A Schottky Barrier diode (SBD) 620 is coupled across the GaN HEMT 502. The anode 624 of the SBD 620 is coupled to the gate 506 of the GaN HEMT 502 and the source 518 of the low-voltage FET 510. The cathode 622 of the SBD 620 is coupled to the source 508 of the GaN HEMT 502. In one embodiment, the SBD 620 is a Silicon (Si) Schottky Barrier diode; however, in other embodiments, a different type of Schottky Barrier diode, or any other unipolar diode, can be utilized.

In at least one embodiment, the switching device 600 may experience a transition current during a transition period of a power switching circuit, similar to the transition period 348 and transition current 340 as discussed above in regard to FIG. 3B. The body diode 512 of the low-voltage FET 510 is a bipolar device having a p-n junction, and thus will develop a forward recovery voltage during a transition period when a transition current is applied to the source 518 of the low-voltage FET 510. However, the SBD 620 is a unipolar device which does not have a p-n junction and thus becomes forward biased before the body diode 512 of the low-voltage FET 510 develops a forward recovery voltage. Being that anode 624 of the SBD 620 is coupled to the gate 506 of the GaN HEMT 502 and the cathode 622 of the SBD 620 is coupled to the source 508 of the GaN HEMT 502, the gate-to-source voltage applied to the GaN HEMT 502 cannot exceed the forward voltage drop of the SBD 620. The forward voltage drop of the SBD 620 is typically less than 1V, thus the gate-to-source voltage of the GaN HEMT 502 is protected from exceeding +5V and charges will not be injected into the GaN HEMT 502.

Once the transition period is over, the GaN HEMT 502 is turned on by enabling the low-voltage FET 510, and current is shared between the low-voltage FET 510 and the SBD 620. In one embodiment, a controller, such as controller 114, may be utilized to determine that the transition period is over and to enable the low-voltage FET 510. While the low-voltage FET 510 is enabled, the voltage drop of the SBD 620 becomes much higher than the low-voltage FET 510, and as a result a majority of the current is switched through the GaN HEMT 502 and the low-voltage FET 510. By regulating the forward recovery voltage of the body diode 512 and preventing the gate-to-source voltage of the GaN HEMT 502 from exceeding +5V, the switching device 600 is able to maintain a high-level of efficiency in high-speed, high-switching applications.

According to at least one embodiment, the switching device 600 is fabricated such that the SBD 620 is connected externally to a substrate 501 containing the GaN HEMT 502 and the low-voltage FET 510. In one embodiment, the substrate 501 containing the GaN HEMT 502 and the low-voltage FET 504 is a Cascode GaN device. In another embodiment, the switching device 500 is fabricated such that the SBD 520 is included on the substrate 501 containing the GaN HEMT 502 and the low-voltage FET 510. By including the SBD 620, GaN HEMT 502, and low-voltage FET 510 on the same substrate 501, any additional voltage drops associated with bonding wires and leads can be minimized to further improve operational efficiency. In other embodiments, the SBD 620, GaN HEMT 502, and low-voltage FET 510 may be fabricated on multiple substrates included in a single package or chip. In one embodiment, the single package is a transistor outline (TO) package.

As discussed above, the controller 114 is configured to monitor and control operation of the UPS 100. Using data stored in associated memory, the controller 114 is operable to execute one or more instructions that may result in the manipulation of one or more switching devices' conductive states. In some examples, the controller 114 can include one or more processors or other types of controllers. The controller 114 may perform a portion of the functions described herein on a processor, and perform another portion using an Application-Specific Integrated Circuit (ASIC) tailored to perform particular operations. Examples in accordance with the present invention may perform the operations described herein using many specific combinations of hardware and software and the invention is not limited to any particular combination of hardware and software components.

As described above, a more efficient, cost-effective, and reliable switching device for use in high-current, high-speed power switching applications is provided herein. The switching device can manage a transition current to prevent a transition voltage applied to the switching device from exceeding a degradation threshold. By preventing the applied transition voltage from exceeding the degradation threshold, the switching device can maintain high operational efficiency in high-speed power switching applications across an expanded range of high-current loads.

Having thus described several aspects of at least one embodiment of this invention, it is to be appreciated various alterations, modifications, and improvements will readily occur to those skilled in the art. Such alterations, modifications, and improvements are intended to be part of this disclosure and are intended to be within the sprit of and scope of this invention. Accordingly, the foregoing description and drawings are by way of example only.

What is claimed is:

1. A power switching circuit, comprising:
a first terminal;
a second terminal;
a third terminal; and
a plurality of switching devices, each switching device having:
a first transistor having a first gate, a first source, and a first drain;
a second transistor having a second gate, a second source, a second drain coupled to the first source, and a bipolar body diode coupled between the second drain and the second source; and
a unipolar diode configured to prevent a transition voltage applied across the first gate and the first source from exceeding a degradation threshold of the first transistor during a transition period,
wherein a first switching device of the plurality of switching devices is coupled between the first terminal and the third terminal and a second switching device of the plurality of switching devices is coupled between the second terminal and the third terminal, and
wherein each switching device of the plurality of switching devices is configured such that the first gate is coupled to the second source.

2. The power switching circuit of claim 1, wherein the unipolar diode of each switching device of the plurality of switching devices has an anode coupled to the second source and a cathode coupled to the first drain.

3. The power switching circuit of claim 1, wherein the unipolar diode of each switching device of the plurality of switching devices has an anode coupled to the first gate and a cathode coupled to the first source.

4. The power switching circuit of claim 1, wherein the first transistor of each switching device is a depletion mode transistor and the second transistor of each switching device is an enhancement mode transistor.

5. The power switching circuit of claim 4, wherein the first transistor of each switching device is a GaN HEMT and the second transistor of each switching device is a low-voltage FET.

6. The power switching circuit of claim 5, wherein the unipolar diode of each switching device is a Schottky Barrier diode.

7. The power switching circuit of claim 6, wherein the GaN HEMT and the low-voltage FET are contained on at least one substrate in a single package.

8. The power switching circuit of claim 7, wherein each switching device is fabricated such that the Schottky Barrier diode is connected externally to the package containing the GaN HEMT and the low-voltage FET.

9. The power switching circuit of claim 7, wherein each switching device is fabricated such that the Schottky Barrier diode is included on the at least one substrate in the package containing the GaN HEMT and the low-voltage FET.

10. The power switching circuit of claim 1, wherein the third terminal is configured to be coupled to an AC power source, the first terminal and the second terminal are configured to be coupled to a DC bus, and the power switching circuit is configured to be operated as a power converter in a UPS.

11. The power switching circuit of claim 1, wherein the first terminal and the second terminal are configured to be coupled to a DC bus, the third terminal is configured to be coupled to a load, and the power switching circuit is configured to operate as a power inverter in a UPS.

12. The power switching circuit of claim 1, wherein the second terminal is coupled to a ground connection.

13. The power switching circuit of claim 1, wherein a third switching device of the plurality of switching devices is coupled between the first terminal and the third terminal and a fourth switching device of the plurality of switching devices is coupled between the second terminal and the third terminal.

14. A method for maintaining operational efficiency of a switching device in a power switching circuit, the switching device having a first transistor and a second transistor, the first transistor having a first gate, a first source, and a first drain, the second transistor having a second gate, a second source coupled to the first gate, a second drain coupled to the first source, and a bipolar body diode coupled between the second drain and the second source, and a unipolar diode having an anode coupled to the second source and a cathode coupled to the first drain, wherein the method comprises:
receiving a transition current at the second source during a transition period of the power switching circuit;
diverting at least a portion of the transition current through the unipolar diode to the first drain such that a transition voltage applied across the first gate and the first source does not exceed a degradation threshold of the first transistor;
determining that the transition period of the power switching circuit has ended; and
enabling, in response to a determination that the transition period has ended, the second transistor such that an operational current applied to the first drain is switched through the first transistor and the second transistor to the second source.

15. The method of claim 14, wherein diverting the transition current through the unipolar diode prevents the transition voltage from exceeding the degradation threshold of the first transistor by reducing a forward recovery voltage of the bipolar body diode of the second transistor.

16. The method of claim 14, wherein the first transistor is a GaN HEMT, the second transistor is a low-voltage FET, and the unipolar diode is a Schottky Barrier diode.

17. A method for maintaining operational efficiency of a switching device in a power switching circuit, the power switching device having a first transistor and a second transistor, the first transistor having a first gate, a first source, and a first drain, the second transistor having a second gate, a second source coupled to the first gate, and a second drain coupled to the first source, and a bipolar body diode coupled between the second drain and the second source, and a unipolar diode having a cathode coupled to the first source and an anode coupled to first, wherein the method comprises:
receiving a transition current at the second source during a transition period of the power switching circuit;
regulating a transition voltage applied across the first gate and the first source via the unipolar diode such that the transition voltage does not exceed a degradation threshold of the first transistor;
determining that the transition period of the power switching circuit has ended; and
enabling, in response to a determination that the transition period has ended, the second transistor such that an operational current applied to the first drain is switched through the first transistor and the second transistor to the second source.

18. The method of claim 17, wherein regulating the transition voltage via the unipolar diode reduces a forward recovery voltage of the bipolar body diode of the second transistor to prevent the transition voltage from exceeding the degradation threshold of the first transistor.

19. The method of claim 17, wherein the first transistor is a GaN HEMT, the second transistor is a low-voltage FET, and the unipolar diode is a Schottky Barrier diode.

* * * * *